United States Patent
Spang et al.

(10) Patent No.: US 9,591,755 B2
(45) Date of Patent: Mar. 7, 2017

(54) POWER SEMICONDUCTOR MODULE COMPRISING MODULE-INTERNAL LOAD AND AUXILIARY CONNECTION DEVICES OF LOW-INDUCTANCE CONFIGURATION

(71) Applicant: Semikron Elektronik GmbH & Co., KG, Nürnberg (DE)

(72) Inventors: Matthias Spang, Stein (DE); Eduard Faller, Fürth (DE); Lars Reußer, Fürth (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 189 days.

(21) Appl. No.: 14/625,045

(22) Filed: Feb. 18, 2015

(65) Prior Publication Data
US 2015/0237727 A1    Aug. 20, 2015

(30) Foreign Application Priority Data

Feb. 18, 2014    (DE) .................. 10 2014 102 018

(51) Int. Cl.
*H05K 1/11*     (2006.01)
*H02M 7/00*    (2006.01)

(52) U.S. Cl.
CPC ............ *H05K 1/111* (2013.01); *H02M 7/003* (2013.01); *H01L 2224/48091* (2013.01); *H01L 2924/13055* (2013.01); *H01L 2924/13091* (2013.01); *H05K 2201/09236* (2013.01);
(Continued)

(58) Field of Classification Search
CPC . H01L 2924/13091; H01L 2224/48091; H01L 2924/13055; H01L 2924/1305; H01L 2224/48472; H01L 2224/49111; H01L 2924/1301; H01L 2224/49175; H05K 2201/10166; H05K 1/111; H05K 2201/09236; H05K 2201/10174; H05K 2201/10053; H02M 7/003
See application file for complete search history.

(56) References Cited

U.S. PATENT DOCUMENTS

| | | | |
|---|---|---|---|
| 5,471,089 A * | 11/1995 | Nagatomo | H01L 23/50 257/691 |
| 6,249,024 B1 * | 6/2001 | Mangtani | H01L 23/642 257/341 |
| 6,381,161 B2 | 4/2002 | Mourick | |

(Continued)

FOREIGN PATENT DOCUMENTS

| | | |
|---|---|---|
| DE | 39 37 045 A1 | 5/1991 |
| DE | 100 37 533 A1 | 1/2002 |

*Primary Examiner* — Adam B Dravininkas
(74) *Attorney, Agent, or Firm* — The Law Offices of Roger S. Thompson

(57) ABSTRACT

A power semiconductor module comprising internal load and auxiliary connection devices embodied as wire bonding connections. A substrate has a plurality of load and auxiliary potential areas, wherein a power switch is arranged on a first load potential area, said power switch being embodied as a plurality of controllable power subswitches arranged in series. The power subswitches have a load bonding connection consisting of a plurality of load bonding wires to a second load potential area, wherein a first bonding base is arranged on the second load potential area and an adjacent second bonding base of the respective load bonding wire is arranged on a contact area of the power subswitch.

20 Claims, 4 Drawing Sheets

(52) U.S. Cl.
CPC ........... *H05K 2201/10053* (2013.01); *H05K 2201/10166* (2013.01); *H05K 2201/10174* (2013.01)

(56) References Cited

U.S. PATENT DOCUMENTS

| | | | | |
|---|---|---|---|---|
| 6,954,368 | B1* | 10/2005 | Francoeur | H02M 7/003 361/763 |
| 8,410,591 | B2* | 4/2013 | Otremba | H01L 23/4952 257/676 |
| 8,637,964 | B2* | 1/2014 | Jones | H01L 25/07 257/668 |
| 2003/0075732 | A1* | 4/2003 | Franke | G01R 1/203 257/200 |
| 2003/0107120 | A1* | 6/2003 | Connah | H01L 23/49562 257/691 |
| 2006/0113664 | A1* | 6/2006 | Shiraishi | H02M 7/003 257/723 |
| 2006/0290689 | A1* | 12/2006 | Grant | H02M 7/003 345/204 |
| 2010/0059875 | A1* | 3/2010 | Sato | H01L 23/4952 257/690 |
| 2011/0310568 | A1* | 12/2011 | Hong | G01R 1/203 361/737 |

\* cited by examiner

POWER SEMICONDUCTOR MODULE COMPRISING MODULE-INTERNAL LOAD AND AUXILIARY CONNECTION DEVICES OF LOW-INDUCTANCE CONFIGURATION

BACKGROUND OF THE INVENTION

1. Field of the Invention

The invention relates to a power semiconductor module, in particular in half-bridge arrangement, comprising load and auxiliary terminal elements, for use in known applications, and also comprising module-internal load and auxiliary connection devices of low-inductance configuration.

2. Description of the Related Art

Known power semiconductor modules, for example the module disclosed in German Patent Application Ser. No. DE 39 37 045 A1, discloses a power semiconductor module having at least one half-bridge comprising three main terminal lines for carrying current between three module main terminals and the semiconductor switches and comprising a ceramic substrate, on which connection conductor tracks for connecting the parallel power transistors are present. In this case, in order to reduce module-internal inductances, the three main terminal lines consist of wide strips at a small distance from one another.

Furthermore, German Patent Application Ser. No. DE 100 37 533 A1 discloses a circuit arrangement in half-bridge topology having low internal parasitic inductances. For this purpose, it is proposed to arrange the individual power transistors of the two power switches in series and to arrange finger-like contact elements between the individual power transistors. With this pressure-contacted arrangement, very low parasitic inductances are achieved in such circuit arrangements.

What is common to both documents is that they are directed to the configuration of the load terminal elements and the arrangement thereof in the interior of the power semiconductor module, without giving further consideration to the configuration of the substrate with power semiconductor components arranged thereon and the connection devices thereof.

SUMMARY OF THE INVENTION

The object of the invention is to provide an improved power semiconductor module.

It is an object of the invention to provide an improved power semiconductor module which is configured so that it fits within predefined standard dimensions and routine positioning of load and auxiliary terminal elements, wherein the module-internal connection devices embodied as wire bonding connections are embodied in a particularly uniform, low-inductance fashion.

The inventive power semiconductor module includes load and auxiliary terminal elements for allowing external contact. The module-internal load and/or the auxiliary connection devices are configured to have low inductance. Module-internal load connection devices are, preferably, wire bonding connections between or to load terminal elements, conductor tracks of the substrate and the contact areas of the power semiconductor components.

In this case, the substrate has a plurality of load and auxiliary potential areas, wherein auxiliary potential areas are preferably embodied as control potential areas or as sensor potential areas and load potential areas have positive or negative DC voltage potential or AC voltage potential.

A power switch is arranged on such a first load potential area, such power switch being preferably embodied as a plurality of controllable power subswitches which are arranged in series and which are preferably embodied in each case as a field effect transistor, in particular as a MOS-FET, or as a bipolar transistor, in particular as an IGBT, with a freewheeling diode reverse-connected in parallel.

The power subswitches have in each case a load bonding connection consisting of a plurality of parallel-arranged load bonding wires to a second load potential area, wherein a first bonding base is arranged on the second load potential area and an adjacent second bonding base of the respective load bonding wire is arranged on a contact area of the power subswitch. The module-internal uniform, low-inductance configuration arises by virtue of the fact(s) that:

a) a control bonding wire electrically connects two assigned auxiliary potential areas to one another and a parallel bonding wire is arranged parallel to said control bonding wire, said parallel bonding wire being electrically connected to only one of the load potential areas; and, alternatively or additionally b) the respective first bonding bases of a plurality of the assigned load bonding wires, and preferably all, of the power subswitches not arranged centrally in the series are arranged in a manner offset from a straight course of the assigned bonding wire, said straight course being perpendicular to the edge of the respective power subswitch, towards the center of the series of the power subswitches; and, alternatively or additionally c) the second load potential area has a current flow direction and the length of those bonding wire sections of the load bonding wires from the first to the nearest, second bonding base increases from one power subswitch to the power subswitch that is adjacent thereto in the current flow direction.

In this context, the course of a load bonding wire should be understood to mean its entire course from the respective second load potential area to its end, in particular also the course above a power subswitch including the contact with its contact areas.

In this case, it is advantageous if a parallel bonding wire has a length of from about 80% to about 120% in particular of from about 90% to about 110%, of the assigned control bonding wire. In this case, the length of such a bonding wire or a bonding wire section as the length from a first bonding base to the adjacent second bonding base should be understood always to mean the geometrical length of the section of a bonding wire measured from the center of the first bonding base over the course of the bonding wire to the center of the adjacent second bonding base.

In one preferred configuration, a parallel bonding wire is maximally at a distance from the assigned control bonding wire of about 1.5 times the minimum safety distance. In this case, the safety distance should be understood always to mean the necessary geometrical distance defined by safety standards in particular with regard to the insulation strength or the safety of persons. Typical test voltages in this regard are greater than the rated operating voltage of the power semiconductor module by a factor of from about 3 to about 5, for example. What is also taken into account in this case, of course, is the relative permittivity of the median between the parallel bonding wire and the control bonding wire, said median being embodied in a technically routine fashion, often as silicone gel.

In the case of low potential differences, meaning those of up to about 50V, between the potential of the control bonding wire and that of the parallel bonding wire, it is preferred for both to be arranged as closely adjacent to one another as permitted by the mechanical boundary conditions of the substrate.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
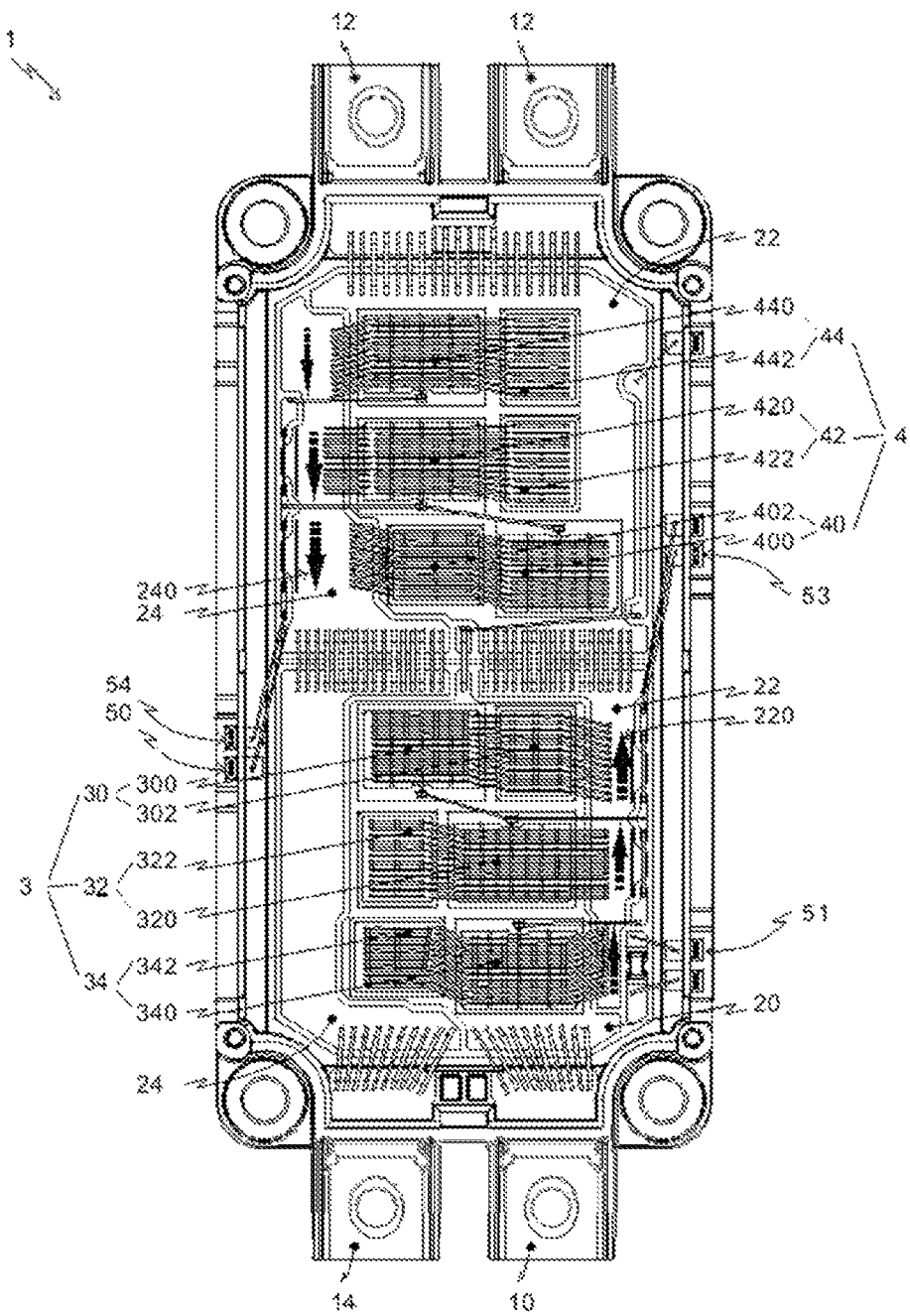
FIG. 1 shows an overall view of a power semiconductor module according to the invention.
Figure 2:
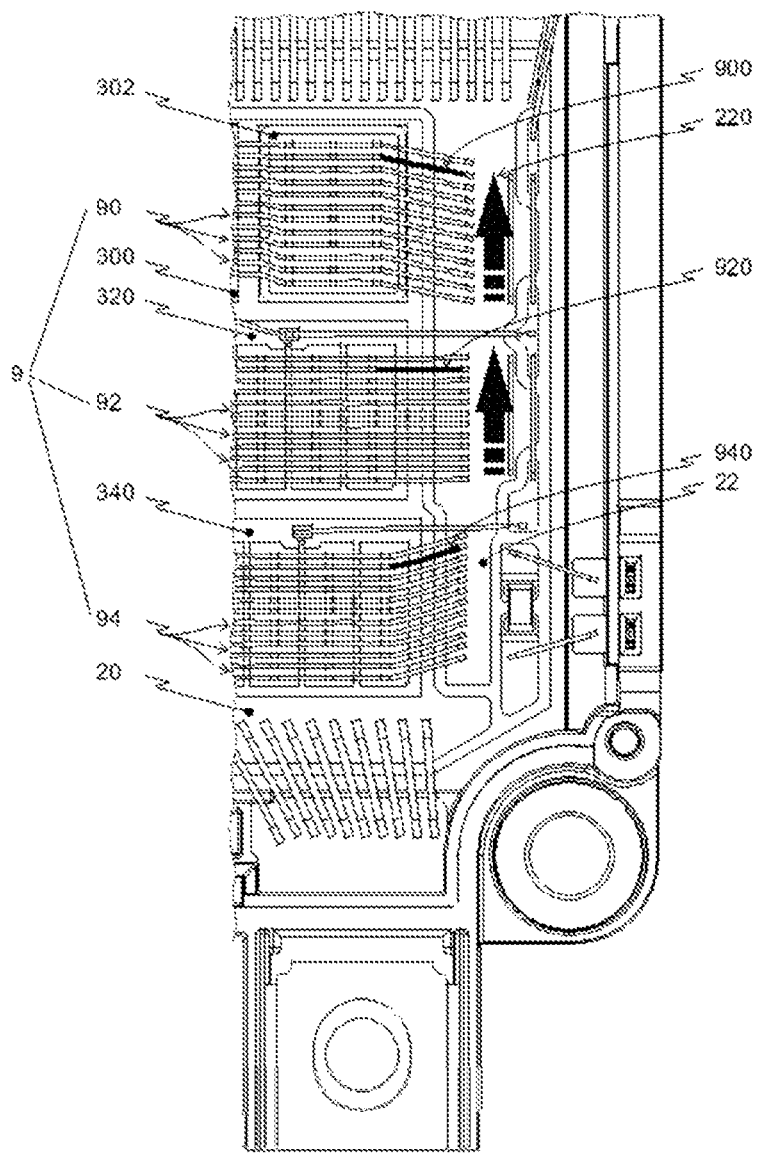
FIGS. 2 and 3 show detail views of the invention illustrated in FIG. 1.
Figure 3:
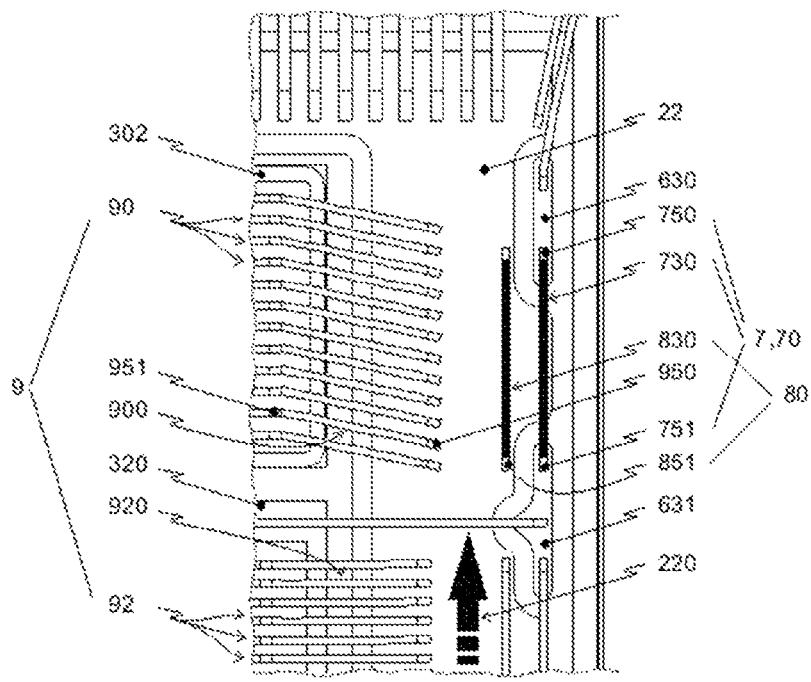
Figure 5:
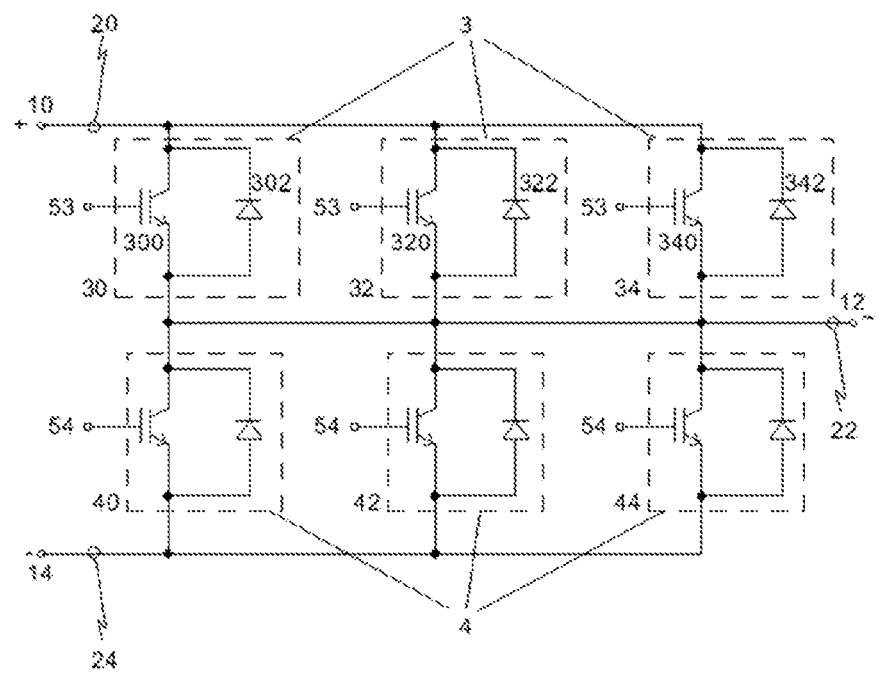
FIG. 5 shows a circuit arrangement of a power semiconductor module according to the invention.

FIGS. 1 to 3 show a power semiconductor module 1 according to the invention. FIG. 1 here shows an overall view, while FIG. 5 shows the circuit arrangement realized therein. The illustrations in FIGS. 2 and 3 are enlarged details of power semiconductor module 1 in accordance with FIG. 1.

Inventive power semiconductor module 1 is embodied in half-bridge topology and thus has an upper power switch 3 and a lower power switch 4 in a technically routine fashion. Both power switches 3, 4 are embodied in each case by means of three power subswitches 30, 32, 34, 40, 42, 44, which here in turn are embodied in each case as an IGBT 300, 320, 340 with assigned freewheeling diode 302, 322, 342. One of ordinary skill in the art will appreciate that this configuration with respectively three IGBTs and three freewheeling diodes can also be modified in a technically routine manner.

The respective power switches 3, 4 are arranged on a first substrate 2, which consists of an electrically insulating main body, on which a plurality of load potential areas 20, 22, 24 and a plurality of auxiliary potential areas 630, 631, in the form of conductor tracks electrically insulated from one another, are arranged. Substrate 2 assigned to upper power switch 3 has a first load potential area 20 preferably having a positive DC voltage potential, on which the power switch 3 itself is also arranged. Load bonding connections 9 extend from those contact areas of the power subswitches 30, 32, 34 of the upper power switch 3 which face away from the substrate 2 to a second load potential area 22, which here has an AC voltage potential. In addition, substrate 2 also has a load potential area 24 having a negative DC voltage potential.

The second substrate, that of lower power switch 4, is embodied, in principle, in a manner corresponding to that of upper power switch 3. The power subswitches 40, 42, 44 of lower power switch 4 here are arranged on a load potential area 22 having an AC voltage potential, which is electrically conductively connected to load potential area 22 having the AC voltage potential of the first substrate. Load bonding connections extend from those contact areas of the power subswitch of lower power switch 4 which face away from the substrate 2 to a second load potential area 24, that having a negative DC voltage potential, which is connected to load potential area 24 having the negative DC voltage potential of the first substrate. DC voltage load terminal elements 10, 14 are electrically conductively connected to the assigned load potential areas 20, 24 of the first substrate, while the doubly embodied AC voltage load terminal element 12 is electrically conductively connected to the assigned load potential area 22 of the second substrate.

The respective power subswitches 30, 32, 34, 40, 42, 44 of upper and lower power switches 3, 4 are thus arranged in series on a first load potential area 20, 22 and are connected to a second load potential area 22, 24 by means of a load bonding connection 9. Said second load potential area 22, 24 then has a current flow direction 220, 240 running parallel to the series of the power subswitches. This configuration results in a different area around which current flows for each power subswitch 30, 32, 34, 40, 42, 44, said area being directly a measure of the parasitic inductance arising as a result thereof. In order that the values of these respective parasitic inductances are approximated to one another as well as possible, two configurations of power semiconductor module 1 are presented here according to the invention, which configurations are preferably intended to be realized jointly.

Firstly, first bonding bases 950 of load bonding wires 90, 92, 94 are arranged in a manner displaced towards the center of the series of the power subswitches 30, 32, 34, 40, 42, 44. In this case, each load bonding wire 90, 92, 94 has a first bonding base 950 arranged on the second load potential area 22, 24. The load bonding wire 90, 92, 94, more precisely its bonding wire section 900, 920, 940, extends from said first bonding base 950 to a second bonding base 951 on a contact area of the assigned power subswitch 30, 32, 34, 40, 42, 44. The respective power subswitches are embodied here as in each case an IGBT 300, 320, 340, 400, 420, 440 and an assigned freewheeling diode 302, 322, 342, 402, 422, 442, wherein the order thereof in the arrangement on the first load potential area 20, 22 is arbitrary in principle. Consequently, second bonding base 951 can be arranged on a contact area of an IGBT or a contact area of a freewheeling diode.

In a technically routine fashion, each load bonding wire 90, 92, 94 has in its course after second bonding base 951 even further bonding bases on the same contact area for example of the IGBT and in the further course also further bonding bases on the contact area of the freewheeling diode. As already mentioned, the order of IGBT and freewheeling diode can also be interchanged in this case.

By virtue of the fact that, as a result of this measure, the current path is shortened in the case of that power subswitch 34, 44 which is first in the current flow direction 220, 240 while the current path 220, 240 is lengthened in the case of that power subswitch 30, 40 which is last, here third, in the current flow direction, the respective parasitic inductances are matched to one another, thus resulting in a uniform, low-inductance configuration. The course of the bonding wire section 900, 920, 940 from the first to the second bonding base 950, 951 of a load bonding wire 90, 92, 94 for each power subswitch 30, 32, 34 is highlighted by way of example in each case in FIG. 2.

Secondly, the length of bonding wire sections 900, 920, 940 of load bonding wires 90, 92, 94 which extend from the first to a nearest second bonding base 950, 951 increases from one of the power subswitches to the power subswitch that is adjacent thereto in the current flow direction. The length of bonding wire sections 900, 920, 940 of load bonding wires 90, 92, 94 in the course proceeding from the respective second bonding base 951, is generally governed technically, as a result of which it is possible to influence the length of the load bonding wires only between first and second bonding bases 950, 951. The second configuration of power semiconductor module 1, that is to say the lengthening of the current path from power subswitch to power subswitch in the current flow direction 200, 220, thus brings about the adaptation, in the sense of a more uniform configuration, of the respective abovementioned parasitic inductances in relation to one another.

Power semiconductor module 1 furthermore comprises auxiliary terminal elements, which are embodied here as auxiliary emitter terminals 50, as temperature sensor terminals 51 and as control terminals 53, 54 for driving controllable power subswitches 30, 32, 34, 40, 42, 44 here for driving IGBTs 300, 320, 340, 400, 420, 440 as a component of the power subswitch. Control terminals 53, 54 in particular are assigned a plurality of auxiliary potential areas 630, 631 on substrate 2. Said auxiliary potential areas are connected to one another in each case by means of a control bonding wire 70.

Figure 4:
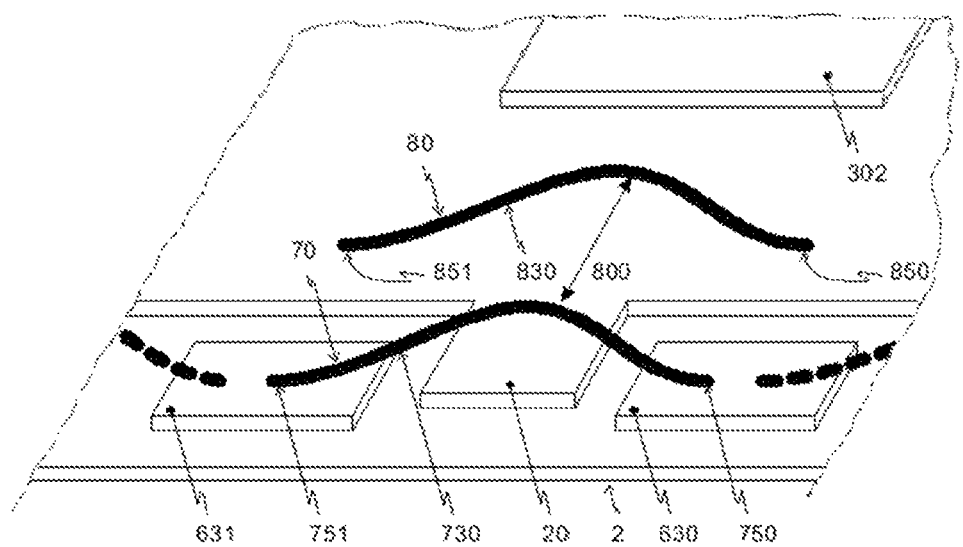
FIG. 4 schematically shows a three-dimensional partial view of a power semiconductor module according to the invention.

So-called parallel bonding wires 80 are arranged parallel to control bonding wires 70, parallel bonding wires 80, in a manner demonstrated by simulations, significantly reducing the parasitic inductances that occur in control bonding wires 70. Parallel bonding wires 80 have a first bonding base 850 on a load potential area 22, a course 830 parallel to control bonding wire 70 assigned to a course 730, and a second bonding base 851 on the same load potential area 22 on which first bonding base 850 is also arranged. The distance 800, as illustrated three-dimensionally in FIG. 4, is approximately the same over the entire course of control bonding wire 70 and parallel bonding wire 80. The distance should be minimal, but must have a minimum safety distance on account of the different potentials, said safety distance being defined by the electrical parameters of power semiconductor module 1. The course from the first 750, to the second bonding base 751 of a control bonding wire 70 and of an assigned parallel bonding wire 80 is highlighted by way of example in each case in FIG. 3.

FIG. 4 schematically shows a corresponding three-dimensional partial view of a power semiconductor module 1 according to the invention, wherein a control bonding wire 70 and an assigned parallel bonding wire 80 and also the bonding bases 750, 751, 850, 851 are illustrated here.

Figure 6:
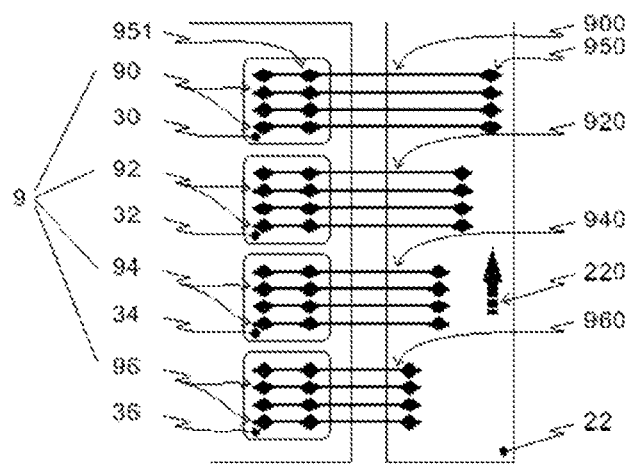
FIG. 6 shows a detail view of a power semiconductor module for illustrating a feature of the invention.

FIG. 6 shows a schematic detail view of a power semiconductor module for illustrating a feature relevant to the invention. Four power semiconductor subswitches 30, 32, 34, 36 and respectively assigned load bonding wires 90, 92, 94, 96 to a second load potential area are illustrated here. In accordance with one configuration of the invention, the length of those bonding wire sections 900, 920, 940, 960 of the load bonding wires 90, 92, 94, 96 from the first 950 to the nearest, second bonding base 951 increases from one power subswitch to the power subswitch that is adjacent thereto in the current flow direction 220.

In the preceding Detailed Description, reference was made to the accompanying drawings, which form a part of his disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module having load and auxiliary terminal elements including module-internal load and auxiliary connection devices of low-inductance configuration having a substrate with a plurality of load and auxiliary potential areas,
   wherein the power semiconductor module comprises:
   a first and second load potential areas;
   a power switch disposed on said first load potential area, said power switch being embodied as a plurality of controllable power subswitches which are arranged in series and each having
      a respective contact area; and
      an assigned load bonding connection which includes a plurality of parallel-arranged load bonding wires that connect to said second load potential area, each of said load bonding wires having
         a first bonding base disposed on said second load potential area; and
         a second bonding base adjacent to said first bonding base, disposed on the contact area of the one of said plurality of power subswitches of which said second bonding base is a part;
   a control bonding wire for electrically connecting two of said auxiliary potential areas to one another; and
   a parallel bonding wire disposed parallel to said control bonding wire, said parallel bonding wire being electrically connected to only one of said load potential areas.

2. The power semiconductor module of claim 1, wherein the respective first bonding bases of a plurality of said assigned load bonding wires of said power subswitches which are not arranged centrally in said series are arranged in a manner offset from a straight course of said assigned load bonding wire, said straight course being perpendicular to an edge of said respective power subswitch, towards the center of said series of said power subswitches.

3. The power semiconductor module of claim 2, wherein said second load potential area has a current flow direction and the length of those bonding wire sections of said load bonding wires from said first bonding base to said nearest second bonding base increases from one power subswitch to said power subswitch that is adjacent thereto in said current flow direction.

4. The power semiconductor module of claim 1, wherein said second load potential area has a current flow direction and the length of those bonding wire sections of said load bonding wires from said first bonding base to said nearest second bonding base increases from one power subswitch to said power subswitch that is adjacent thereto in said current flow direction.

5. The power semiconductor module of claim 1, wherein all first bonding bases of said assigned load bonding wires are arranged in a manner offset towards said center of said series of said power subswitches.

6. The power semiconductor module of claim 1, wherein a controllable power sub switch is embodied as a field effect transistor.

7. The power semiconductor module of claim 6, wherein said field effect transistor is a MOS-FET.

8. The power semiconductor module of claim 1, wherein a controllable power subswitch is embodied as a bipolar transistor with a freewheeling diode reverse-connected in parallel.

9. The power semiconductor module of claim 8, wherein said bipolar transistor is an IGBT.

10. The power semiconductor module of claim 1, wherein a load potential area has a positive DC voltage potential.

11. The power semiconductor module of claim 1, wherein a load potential area has a negative DC voltage potential.

12. The power semiconductor module of claim 1, wherein a load potential area has an AC voltage potential.

13. The power semiconductor module of claim 1, wherein an auxiliary potential area has a drive potential.

14. The power semiconductor module of claim 1, wherein a parallel bonding wire has a length of from about 80% to about 120% of said assigned control bonding wire.

15. The power semiconductor module of claim 14, wherein said parallel bonding wire has a length of from about 90% to about 110% of said assigned control bonding wire.

16. The power semiconductor module of claim 1, wherein When the potential differences between the potential of said control bonding wire and that of said parallel bonding wire is low, both are arranged as closely adjacent to one another as permitted by the mechanical boundary conditions of the substrate.

17. The power semiconductor module of claim 1, wherein a parallel bonding wire is maximally at a distance from said assigned control bonding wire of about 1.5 times the minimum safety distance.

18. A power semiconductor module having load and auxiliary terminal elements including module-internal load and auxiliary connection devices of low-inductance configuration having a substrate with a plurality of load and auxiliary potential areas,
wherein the power semiconductor module comprises:
a first and second load potential areas; and
a power switch disposed on said first load potential area, said power switch being embodied as a plurality of controllable power subswitches which are arranged in series and each having
a respective contact area; and
an assigned load bonding connection which includes a plurality of parallel-arranged load bonding wires that connect to said second load potential area, each of said load bonding wires having
a first bonding base disposed on said second load potential area; and
a second bonding base adjacent to said first bonding base, disposed on the contact area of the one of said plurality of power subswitches of which said second bonding base is a part;
wherein the respective first bonding bases of a plurality of said assigned load bonding wires of said power subswitches which are not arranged centrally in said series are arranged in a manner offset from a straight course of said assigned load bonding wire, said straight course being perpendicular to an edge of said respective power subswitch, towards the center of said series of said power subswitches.

19. The power semiconductor module of claim 18, wherein
said second load potential area has a current flow direction and the length of those bonding wire sections of said load bonding wires from said first bonding base to said nearest second bonding base increases from one power subswitch to said power subswitch that is adjacent thereto in said current flow direction.

20. A power semiconductor module having load and auxiliary terminal elements including module-internal load and auxiliary connection devices of low-inductance configuration having a substrate with a plurality of load and auxiliary potential areas,
wherein the power semiconductor module comprises:
a first and second load potential areas; and
a power switch disposed on said first load potential area, said power switch being embodied as a plurality of controllable power subswitches which are arranged in series and each having
a respective contact area; and
an assigned load bonding connection which includes a plurality of parallel-arranged load bonding wires that connect to said second load potential area, each of said load bonding wires having
a first bonding base disposed on said second load potential area; and
a second bonding base adjacent to said first bonding base, disposed on the contact area of the one of said plurality of power subswitches of which said second bonding base is a part;
wherein said second load potential area has a current flow direction and the length of those bonding wire sections of said load bonding wires from said first bonding base to said nearest second bonding base increases from one power subswitch to said power subswitch that is adjacent thereto in said current flow direction.

* * * * *